(12) United States Patent
Letzelter et al.

(10) Patent No.: US 9,336,335 B2
(45) Date of Patent: May 10, 2016

(54) SELECTION OF A MANIPULATOR OF AN OBJECT AMONG A PLURALITY OF MANIPULATORS

(75) Inventors: Frédéric Letzelter, Longjumeau (FR); Mathieu Gunther, Le Chesnay (FR)

(73) Assignee: Dassault Systèmes, Velizy Villacoublay (FR)

( * ) Notice: Subject to any disclaimer, the term of this patent is extended or adjusted under 35 U.S.C. 154(b) by 355 days.

(21) Appl. No.: 13/460,434

(22) Filed: Apr. 30, 2012

(65) Prior Publication Data
US 2012/0290958 A1 Nov. 15, 2012

(30) Foreign Application Priority Data

May 11, 2011 (EP) .................................... 11305563

(51) Int. Cl.
*G06F 3/048* (2013.01)
*G06F 17/50* (2006.01)
*G06F 3/0484* (2013.01)

(52) U.S. Cl.
CPC ............ *G06F 17/50* (2013.01); *G06F 3/04842* (2013.01)

(58) Field of Classification Search
CPC .................................. G06F 17/50; F09F 5/00
USPC ................................................. 715/764, 852
See application file for complete search history.

(56) References Cited

U.S. PATENT DOCUMENTS

| 5,861,889 | A * | 1/1999 | Wallace et al. | 345/619 |
|---|---|---|---|---|
| 7,110,005 | B2 * | 9/2006 | Arvin et al. | 345/619 |
| 7,302,650 | B1 | 11/2007 | Allyn et al. | |
| 7,689,936 | B2 * | 3/2010 | Rosel | 715/852 |
| 8,675,014 | B1 * | 3/2014 | Milne et al. | 345/629 |
| 2004/0046769 | A1 | 3/2004 | Arvin et al. | |
| 2005/0179703 | A1 | 8/2005 | Johnson | |
| 2009/0085911 | A1 * | 4/2009 | Fitzmaurice et al. | 345/419 |
| 2010/0153507 | A1 * | 6/2010 | Wei et al. | 709/206 |

OTHER PUBLICATIONS

Sutherland I E Ed—American Federation of Information Processing Societies: "Sketchpad A Man-Machine Graphical Communication System", Proceedings of the Spring Joint Computer Conference, 23:329-346 (May 1, 1963).
James D Foley, et al., "Fundamentals of Interactive Computer Graphics (Chapters 4, 5)", *Systems Programming Series*, pp. 137-215 (Jul. 1984).

(Continued)

*Primary Examiner* — William Bashore
*Assistant Examiner* — Jeanette J Parker
(74) *Attorney, Agent, or Firm* — Hamilton, Brook, Smith & Reynolds, P.C.

(57) ABSTRACT

The invention discloses a computer-implemented process for selecting a manipulator of an object among a plurality of objects displayed in a graphical user interface, each object comprising at least one manipulator. The process comprises the steps of providing a set of manipulators, wherein each manipulator comprises at least one picking area and at least two picking areas of different manipulators of the set overlap;

receiving, upon a user interaction with the graphical user interface, an event applied on the said at least two overlapping picking areas;

triggering a set of filters for selecting one manipulator of the set to be activated.

8 Claims, 4 Drawing Sheets

(56) References Cited

OTHER PUBLICATIONS

Scott E. Hudson, et al., "Extensible Input Handling in the Subarctic Toolkit", Proceedings of the Sigchi Conference on Human Factors in Computing Systems, Chi '05, 381 (Apr. 2-7, 2005).

Michael Braitmaier, et al., "Openmanip: An Extensible Cross-Scene-Graph Framework for Direct Object Manipulation", Opensg Symposium, pp. 1-7 (Jan. 1, 2003).

European Search Report in European Patent Application 11305563.6 dated Jan. 31, 2012.

* cited by examiner

SELECTION OF A MANIPULATOR OF AN OBJECT AMONG A PLURALITY OF MANIPULATORS

RELATED APPLICATION(S)

This application claims priority under 35 U.S.C. §119 or 365 to European Patent Application No. 11305563.6, filed May 11, 2011.

The entire teachings of the above application(s) are incorporated herein by reference.

FIELD OF THE INVENTION

The invention relates to the field of computer programs and systems, and more specifically to a process, apparatus and program for selecting a manipulator of an object among a plurality of objects displayed in a graphical user interface, each object comprising at least one manipulator.

BACKGROUND

A number of systems and programs are offered on the market for the design, the engineering and the manufacturing of objects. These objects can be two-dimensional or three-dimensional objects.

CAD is an acronym for Computer-Aided Design, e.g. it relates to software solutions for designing an object. CAE is an acronym for Computer-Aided Engineering, e.g. it relates to software solutions for simulating the physical behavior of a future product. CAM is an acronym for Computer-Aided Manufacturing, e.g. it relates to software solutions for defining manufacturing processes and operations. In such computer-aided design systems, the graphical user interface plays an important role as regards the efficiency of the technique. These techniques may be embedded within Product Lifecycle Management (PLM) systems. PLM refers to a business strategy that helps companies to share product data, apply common processes, and leverage corporate knowledge for the development of products from conception to the end of their life, across the concept of extended enterprise.

Computer programs are widely available for creating drawings and other documents with graphic content. These programs incorporate a variety of tools to aid a user in creating and manipulating objects, such as graphics, icons, geometric shapes, images, and blocks of text, through a computer display. In CAD solution such as the one provided by DASSAULT SYSTEMES under the trademark CATIA, the user is always interacting with the geometries, thanks to manipulators. Manipulators are also known as handle-based tool (or handle). A user can perform an operation on a larger graphical object by directing a pointer to a manipulator (or handle) and clicking, dragging, or otherwise gesturing with the pointer. The interactions are performed on a display device using a pointer that is under the control of a mouse, trackball, or stylus. The interactions can also be performed directly on a touch sensitive display device using a pointer, e.g. a finger, or a stylus. The manipulators are immersive objects, which allow the user to trigger a function such as deforming, moving, and transforming the geometries directly in the scene wherein the object to modify is located. The manipulators can include one or more miniature graphics or icons that are displayed in association with a larger graphical object. The manipulators can be represented by squares, spheres, meshes, or any other complex shapes such as robots, axis, and so on.

Figure 4:
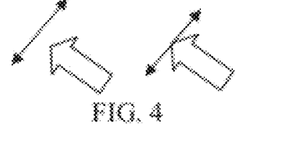
FIGS. 4 to 7 shows the different ways to interact with a manipulator as known in the prior art.

Several ways to interact with those manipulators exist. The action to interact with a manipulator is also called picking the manipulator. The first way to interact with a manipulator is "a pixel precision" solution wherein the active area of the manipulator is exactly the same than the visible representation of the manipulator. The active area is the visible zone on the screen in which the user can trigger a function applied on an object. This is a WYSIWYG (What You See Is What You Get) behavior. This is illustrated on FIG. 4 that shows, on the left, a cursor that is not precisely on the manipulator (the double-headed arrow), and therefore, the manipulator is not active; on the right of FIG. 4, the cursor is on the manipulator, which is therefore active.

Figure 5:
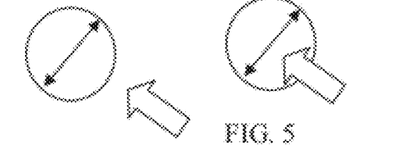

The second way to interact with a manipulator relies on an "extended picking area". The picking area represents the surface on which it is possible to send an event to the manipulator. This is illustrated on FIG. 5 that shows a manipulator (the double headed arrow) and its picking area (the circle): on the left, the cursor is not on the picking area, and the manipulator is not active; on the right of the figure, the cursor is on the picking area and the manipulator is active. The picking area is the zone of the screen in which the user can trigger a function applied on an object. The visible representation of the manipulator is extended by an active invisible area (the picking area), and the user can pick the manipulator even at a distance from the object. The picking area can be visible or not.

Figure 6:
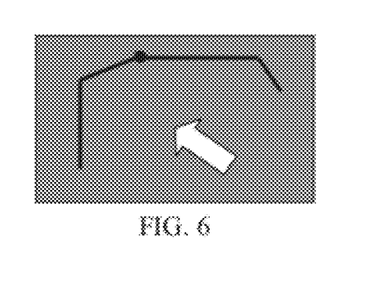

The third way to interact with a manipulator relies on the "manipulate always and everywhere" solution in which the whole screen is meant to interact with the manipulator. Therefore, selection is no more possible. FIG. 6 shows a graphical user interface in which the cursor is always picking the area as the picking area takes the whole screen.

Figure 7:
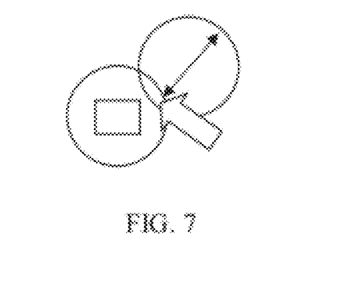

The above-mentioned ways to interact with a manipulator come with their drawbacks. The pixel precision solution comes with lack of productivity and ergonomics: indeed, the user must precisely pick the visible representation (which can be only one or two pixel thick) which breaks his workflow. The extended picking area solution comes with picking issues when several manipulators are overlapping on the screen. There is no way to differentiate which one must be activated. As a result, unpredictable result could appear. This is illustrated on FIG. 7 wherein a cursor is inside both picking areas of two manipulators (the double-headed arrow and the square). This solution is therefore not satisfactory when several manipulators are overlapping. The always and everywhere solution is not compatible with other technologies, as the invisible representation takes the focus on the whole screen. As a result, this is useful when only one manipulator is required, but cannot be used with several independent ones.

Within this context, there is still a need for an improved selection of a manipulator displayed in a graphical user interface among a plurality of overlapping manipulators.

SUMMARY OF THE INVENTION

According to one aspect, the invention therefore provides a computer-implemented process for selecting a manipulator of an object among a plurality of objects displayed in a graphical user interface, each object comprising at least one manipulator, the process comprising the steps of:
  providing a set of manipulators, wherein each manipulator comprises at least one picking area and at least two picking areas of different manipulators of the set overlap;
  receiving, upon a user interaction with the graphical user interface, an event applied on the said at least two overlapping picking areas;

triggering a set of filters for selecting one manipulator to be activated in the set of manipulators.

The process may comprise one or more of the following:

selecting manipulators from the set of manipulators, each selected manipulator having at least one picking area receiving the event;

casting a ray from a location in the graphical user interface and determining an intersection between the ray and the said at least two overlapping picking areas;

the set of filters comprises at least two of the following filters:

creating a subset of manipulators that are concerned by the event;

creating a subset of manipulators according to a priority associated with each manipulator;

creating a subset of manipulators whose respective points have the shortest distances from a location in the graphical user interface;

selecting the manipulator having the closest distance from the user viewpoint;

the filters of the set are sequentially triggered;

subscribing manipulators to a manipulator manager.

the step of subscribing the manipulator comprises:

storing, for each manipulator, a respective identifier into a first list stored in a storage managed by the manipulator manager;

storing, for each manipulator, the respective at least one picking area into a second list stored in the storage managed by the manipulator manager.

searching in the first list and retrieving the identifiers corresponding the said at least two overlapping picking areas receiving an event stored in the second list, and identifying the respective manipulators of the retrieved identifiers;

The invention further proposes an apparatus for selecting a manipulator of an object among a plurality of objects displayed in a graphical user interface, each object comprising at least one manipulator, the apparatus comprising means for performing the process of the invention.

The invention further proposes a computer program comprising instructions for execution by a computer, the instructions comprising means for performing the process of the invention.

The invention further proposes a computer readable storage medium having recorded thereon the above computer program.

BRIEF DESCRIPTION OF THE DRAWINGS

Embodiments of the invention will now be described, by way of non-limiting example, and in reference to the accompanying drawings, where.

DETAILED DESCRIPTION OF THE INVENTION

It is proposed a computer-implemented process for selecting a manipulator of an object among a plurality of objects displayed in a graphical user interface. Each object comprises at least one manipulator. A manipulator is associated with an object and performs a function to this object. The manipulator is itself an object. The manipulator is embedded with its associated object in a scene (which can be a two-dimensional or three-dimensional scene) wherein its associated object is located. This amounts to say that a manipulator is an immersive object in the scene that allows the user to trigger a function that is applied to the object associated to the manipulator. The process comprises providing a set of manipulators. Each manipulator comprises at least one picking area. The picking area of a manipulator is a surface for interacting with the manipulator: an event received by the picking area is sent to the manipulator. Sending an event to the manipulator means that a signal having a specific meaning is received by the manipulator through its picking area. The picking area can be visible or not to the user. In practice, the picking area has a larger surface than the graphical representation of the manipulator. The picking area can have several shapes, and the shapes can be two-dimensional (2D) or three-dimensional (3D) shapes. The picking area is part of the manipulator so that the picking area is also an immersive object. In the process, at least two picking areas of different manipulators of the set overlap. Two picking areas overlap when both picking areas have an intersection. The process comprises receiving, upon a user interaction with the graphical user interface, an event applied on the said at least two overlapping picking areas. Thus, at least two picking areas are concerned by the event sent upon user action. Next, a set of filters is triggered for selecting one manipulator of the set of manipulators, and then the selected manipulator is activated.

The process according to the invention allows the selection of one manipulator when several manipulator are likely to be selected, typically when the respective picking area of the manipulator overlap. This improves the user experience and the ergonomy of the selection of a manipulator. Especially, it is possible to mix the "pixel precision", "extended picking area", "manipulate always and everywhere" solutions without encountering picking issues. In addition, the screen space is optimal as all manipulators can interact at the same time. Furthermore, the process is fully compatible with all devices adapted for sending an event, e.g. pen tablets, multi-touch hardware, virtual reality, and so on. The invention further allows operations to be parallelized as all manipulators can be displayed at the same time. As a result, if several interactions (several touch points for example) are detected, the correct underlying manipulator will be activated at each point location.

The process is computer-implemented. This means that the steps (or substantially all the steps) of the process are executed by at least one computer. In examples, the triggering of at least some of the steps of the process may be performed through user-computer interaction. The level of user-computer interaction required may depend on the level of automatism foreseen and put in balance with the need to implement the user's wishes. In examples, this level may be user-defined and/or pre-defined.

For instance, the step of receiving an event applied on at least two picking areas is triggered upon user interaction in the graphical user interface: the designer moves a cursor controlled by a pointing device such as a mouse over the respective picking areas of two manipulator, and then they click on a button of the mouse for sending an event to the manipulator.

A typical example of computer-implementation of the process is to perform the process with a system comprising a graphical user interface (GUI) suitable for this purpose. The GUI is coupled with a memory and a processor. The memory, which stores a database, is merely any hardware suitable for such storage.

By "database", it is meant any collection of data (i.e. information) organized for search and retrieval. When stored on a memory, the database allows a rapid search and retrieval by a computer. Databases are indeed structured to facilitate storage, retrieval, modification, and deletion of data in conjunction with various data-processing operations. The database may consist of a file or set of files that can be broken down into records, each of which consists of one or more fields. Fields are the basic units of data storage. Users may retrieve data primarily through queries. Using keywords and sorting commands, users can rapidly search, rearrange, group, and select the field in many records to retrieve or create reports on particular aggregates of data according to the rules of the database management system being used.

In the case of the process, the database comprises a first file (or list) for storing, for each manipulator, a respective identifier, and a second file (or list) for storing the respective picking area(s) of each manipulator. These first and second files are in relation: this makes it possible to retrieve the identifier of a manipulator from the picking area(s) of the manipulator, and inversely.

The process can apply to manipulators of modeled objects. A modeled object is any object defined by data stored in the database. By extension, the expression "modeled object" designates the data itself. According to the type of the system, the modeled objects may be defined by different kinds of data. The system may indeed be any combination of a CAD system, a CAE system, a CAM system, and/or a PLM system.

In those different systems, modeled objects are defined by corresponding data. One may accordingly speak of CAD object, PLM object, CAE object, CAM object, CAD data, PLM data, CAM data, and CAE data. However, these systems are not exclusive one of the other, as a modeled object may be defined by data corresponding to any combination of these systems. A system may thus well be both a CAD and PLM system, as will be apparent from the definitions of such systems provided below.

By CAD system, it is meant any system suitable at least for designing a modeled object on the basis of a graphical representation of the modeled object, such as CATIA. In this case, the data defining a modeled object comprise data allowing the representation of the modeled object. A CAD system may for example provide a representation of CAD modeled objects using edges or lines, in certain cases with faces or surfaces. Lines, edges, or surfaces may be represented in various manners, e.g. non-uniform rational B-splines (NURBS). Specifically, a CAD file contains specifications, from which geometry may be generated, which in turn allows for a representation to be generated. Specifications of a modeled object may be stored in a single CAD file or multiple ones. The typical size of a file representing a modeled object in a CAD system is in the range of one Megabyte per part. And a modeled object may typically be an assembly of thousands of parts.

In the context of CAD, a modeled object may typically be a 3D modeled object, e.g. representing a product such as a part or an assembly of parts, or possibly an assembly of products. By "3D modeled object", it is meant any object which is modeled by data allowing its 3D representation. A 3D representation allows the viewing of the part from all angles. For example, a 3D modeled object, when 3D represented, may be handled and turned around any of its axes, or around any axis in the screen on which the representation is displayed. This notably excludes 2D icons, which are not 3D modeled. The display of a 3D representation facilitates design (i.e. increases the speed at which designers statistically accomplish their task). This speeds up the manufacturing process in the industry, as the design of the products is part of the manufacturing process.

A CAD system may be history-based. In this case, a modeled object is further defined by data comprising a history of geometrical features. A modeled object may indeed be designed by a physical person (i.e. the designer/user) using standard modeling features (e.g. extrude, revolute, cut, and/or round etc.) and/or standard surfacing features (e.g. sweep, blend, loft, fill, deform, smoothing and/or etc.). Many CAD systems supporting such modeling functions are history-based system. This means that the creation history of design features is typically saved through an acyclic data flow linking the said geometrical features together through input and output links The history based modeling paradigm is well known since the beginning of the 80's. A modeled object is described by two persistent data representations: history and B-rep (i.e. boundary representation). The B-rep is the result of the computations defined in the history. The shape of the part displayed on the screen of the computer when the modeled object is represented is (a tessellation of) the B-rep. The history of the part is the design intent. Basically, the history gathers the information on the operations which the modeled object has undergone. The B-rep may be saved together with the history, to make it easier to display complex parts. The history may be saved together with the B-rep in order to allow design changes of the part according to the design intent.

By PLM system, it is meant any system suitable for the management of a modeled object representing a physical manufactured product. In a PLM system, a modeled object is thus defined by data suitable for the manufacturing of a physical object. These may typically be dimension values and/or tolerance values. For a correct manufacturing of an object, it is indeed better to have such values.

By CAE system, it is meant any system suitable for the analysis of the physical behaviour of a modeled object. In a CAE system, a modeled object is thus defined by data suitable for the analysis of such behaviour. This may be typically a set of behavioring features. For instance, a modeled object corresponding to a door may be defined by data indicating that the door rotates around an axis.

Figure 2:
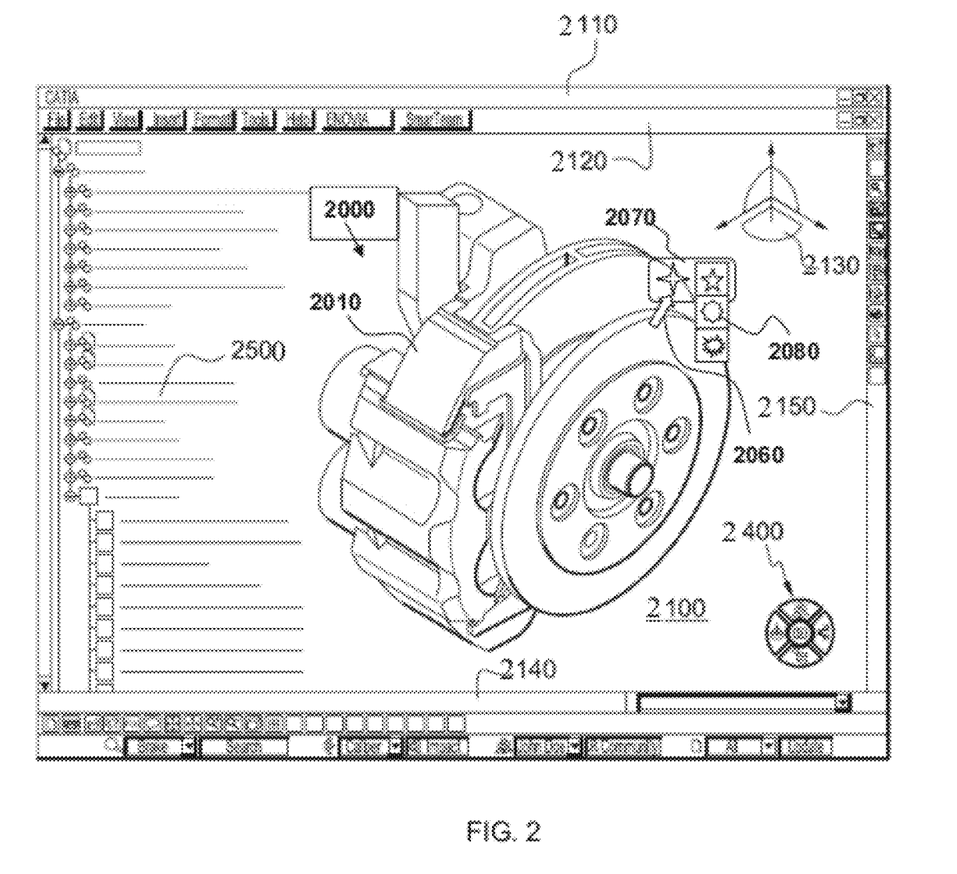
FIG. 2 shows an example of a graphical user interface.

FIG. 2 shows an example of the GUI of the system, wherein the system is a CAD system.

The GUI 2100 may be a typical CAD-like interface, having standard menu bars 2110, 2120, as well as bottom and side toolbars 2140, 2150. Such menu- and toolbars contain a set of user-selectable icons, each icon being associated with one or more operations or functions, as known in the art. Some of these icons are associated with software tools, adapted for editing and/or working on the 3D modeled object 2000 displayed in the GUI 2100. The software tools may be grouped into workbenches. Each workbench comprises a subset of software tools. In particular, one of the workbenches is an edition workbench, suitable for editing geometrical features of the modeled product 2000. In operation, a designer may for example pre-select a part of the object 2000 and then initiate an operation (e.g. change the dimension, color, etc.) or edit geometrical constraints by selecting an appropriate icon. For example, typical CAD operations are the modeling of the punching or the folding of the 3D modeled object displayed on the screen.

The GUI may for example display data 2500 related to the displayed product 2000. In the example of FIG. 2, the data 2500, displayed as a "feature tree", and their 3D representation 2000 pertain to a brake assembly including brake caliper and disc. The GUI may further show various types of graphic tools 2130, 2070, 2080 for example for facilitating 3D orientation of the object, for triggering a simulation of an operation of an edited product or render various attributes of the displayed product 2000. A cursor 2060 may be controlled by a haptic device to allow the user to interact with the graphic tools.

Figure 3:
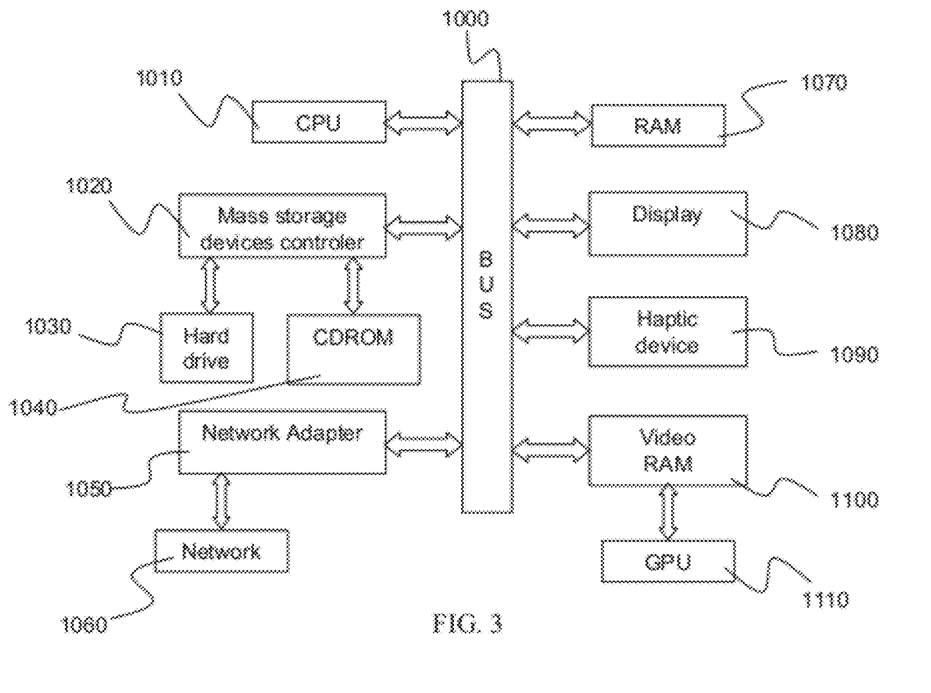
FIG. 3 shows an example of a client computer system.

FIG. 3 shows a client computer system, e.g. a workstation of a user.

The client computer comprises a central processing unit (CPU) 1010 connected to an internal communication BUS 1000, a random access memory (RAM) 1070 also connected to the BUS. The client computer is further provided with a graphical processing unit (GPU) 1110 which is associated with a video random access memory 1100 connected to the BUS. Video RAM 1100 is also known in the art as frame buffer. A mass storage device controller 1020 manages accesses to a mass memory device, such as hard drive 1030. Mass memory devices suitable for tangibly embodying computer program instructions and data include all forms of nonvolatile memory, including by way of example semiconductor memory devices, such as EPROM, EEPROM, and flash memory devices; magnetic disks such as internal hard disks and removable disks; magneto-optical disks; and CD-ROM disks 1040. Any of the foregoing may be supplemented by, or incorporated in, specially designed ASICs (application-specific integrated circuits). A network adapter 1050 manages accesses to a network 1060. The client computer may also include a haptic device 1090 such as cursor control device, a keyboard or the like. A cursor control device is used in the client computer to permit the user to selectively position a cursor at any desired location on display 1080, as mentioned with reference to FIG. 2. In addition, the cursor control device allows the user to select various commands, and input control signals. The cursor control device includes a number of signal generation devices for input control signals to system. Typically, a cursor control device may be a mouse, the button of the mouse being used to generate the signals.

A computer program may comprise instructions by a computer, the instructions comprising means for causing the above system to perform the above process. The invention may for example be implemented in digital electronic circuitry, or in computer hardware, firmware, software, or in combinations of them. Apparatus of the invention may be implemented in a computer program product tangibly embodied in a machine-readable storage device for execution by a programmable processor; and process steps of the invention may be performed by a programmable processor executing a program of instructions to perform functions of the invention by operating on input data and generating output.

The invention may advantageously be implemented in one or more computer programs that are executable on a programmable system including at least one programmable processor coupled to receive data and instructions from, and to transmit data and instructions to, a data storage system, at least one input device, and at least one output device. The application program may be implemented in a high-level procedural or object-oriented programming language or in assembly or machine language if desired; and in any case, the language may be a compiled or interpreted language.

Figure 1:
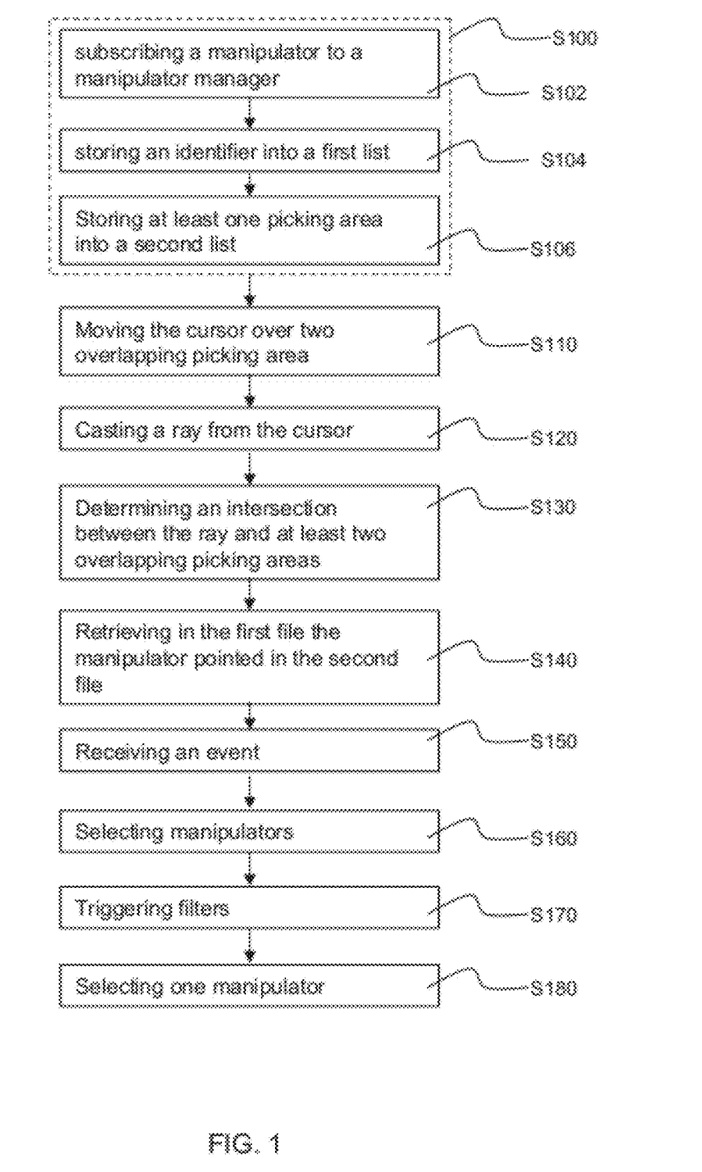
FIG. 1 shows a flowchart of an example of the process.

An example of the process is now depicted in reference to FIG. 1. At step S100, a set of manipulator is provided, each manipulator comprising at least one picking area and at least two picking areas of different manipulators of the set overlap. The manipulator may rely on the known Model-view-controller (MVC) software architecture, wherein the Model manages the behavior and data of the application domain, responds to requests for information and to instructions to change state (usually from the Controller). The View renders the model into a form suitable for interaction, typically a user interface element. The Controller receives user input and initiates a response by making calls on model objects.

The manipulators are provided with a plurality objects displayed on a graphical user interface (GUI) as the one depicted on FIG. 2. Each object comprises at least one manipulator. In addition, at least two picking areas of different objects overlap, that is to say, the picking areas intersect. A picking area is a surface adapted for receiving an event and transmitting the event to the manipulator. The surface of the picking zone defined by a picking area can be two (2D) or three-dimensional (3D). For instance, as illustrated on FIG. 7, two manipulators (a double-headed arrow and a square) are in a 2D space, with their respective 2D picking areas that overlap: there is an intersection between the surfaces (two disks) defined by the two picking areas. It is to be understood that such a situation can also occurs in a 3D space. In the 3D space, the picking area of the manipulator may intersect, the picking area being a 2D surface (e.g. a disk) or a 3D surface (e.g. a sphere). In any case, two picking areas overlap when a ray that is cast from the user viewpoint toward a first picking area intersects this first picking area and at least another picking area.

The step of providing a set of manipulators can comprise the subscription (or registering) of the manipulator of the set to a manipulator manager (S102). In MVC architecture, the subscription may be carried out by the Controller to the manipulator manager. The manipulator manager manages manipulators, that is, it administrates each manipulator individually and the relations between the manipulators. The manipulator manager acts as a server in the client-server model, and the manipulators acts as the client. The manipulator manager may advantageously be implemented in one or more computer programs that are executable on a programmable system.

The subscription may comprise a first sub-step (S104) of storing an identifier of the manipulator into a first list. The first list may be stored on a storage (or storage means), e.g. on a memory or on database. The respective identifier of each manipulator is preferably a unique identifier that is assigned when the manipulator is created. Alternatively, the unique identifier may be assigned by the manipulator manager during the subscription process.

The subscription step may also comprise a second sub-step of storing at least one picking area of the manipulator into a second list (S106). Storing a picking area in the second list means that information characterizing the picking area is stored, e.g. an identifier of the picking area. Similarly, the second list may be stored on a storage (or storage means) such as a memory or on a database. Preferably, the picking area(s) of the manipulator are declared by the manipulator to the manipulator manager.

The first and second lists are built so that it is possible to retrieve the identifier of a manipulator from the picking area(s) of the manipulator, and inversely. In other term, it is possible to retrieve in the second list the picking area(s) of a manipulator from the identifier of the manipulator stored in the first list; it is also possible to retrieve in the first list the identifier of the manipulator from a picking area stored in the second list; the respective manipulators of the retrieved identifier is then identified. The relations between the first and second lists may for instance rely on pointers between the two lists. There is therefore a correspondence between the first and the second list. It is to be understood that the first and second lists may be part of a table.

Figure 8:
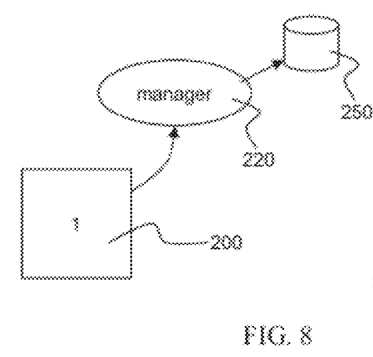
FIGS. 8 to 11 shows interactions between a manipulator and a manipulator manager according to the invention.
Figure 9:
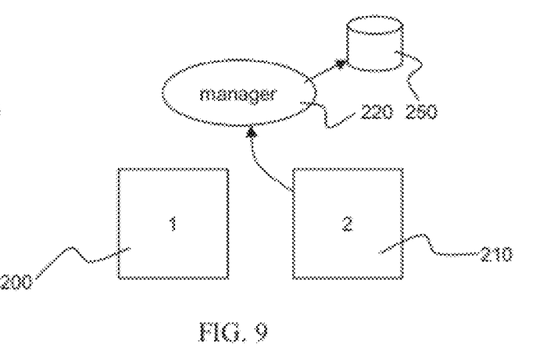

Referring now to FIGS. 8 and 9, the subscription of two manipulators is illustrated. At FIG. 8, a first manipulator having a picking area 200 has been created and sends a request of subscription to a manipulator manager 220. The manipulator manager then stores the identifier of the manipulator having the picking area 200 and the picking area 200 of the manipulator in the database 250. It is to be understood that the two databases (or more) may be used for storing these information. FIG. 9 shows the same steps for a second manipulator having the picking area 210.

Referring back to FIG. 1, a pointing device (e.g. a cursor) is moved over two overlapping picking areas (S110). The cursor may be as the one 2060 displayed on FIG. 2. The cursor 2060 may be controlled by a haptic device to allow the user to interact with the graphic tools. Moving the pointing device over two overlapping picking areas means that the cursor and two overlapping picking areas are intersected by a ray.

Then, a ray is cast from the cursor (S120). The ray casting is performed as known in the art. Typically, the ray is cast from a point on the cursor, e.g. the end of the arrow of the cursor. In practice, the ray is perpendicular to the display device on which the objects and the manipulators are displayed. Alternatively, the ray casting may be performed according to the viewpoint of the user, as known in the art. The ray casting may be indifferently applied to both manipulator in a 2D or 3D space.

During ray casting, it is determined whether or not the ray intersects at least two overlapping picking areas (S130).

Preferably, ray casting and intersection determination steps are continuously performed. Advantageously, the system knows at each time whether or not the ray intersects several picking areas, that is, whether or not picking areas overlap under the position of the cursor.

Then, at step S140, the first list is searched for retrieving the identifiers corresponding to the said at least two overlapping picking areas receiving an event, the said at least two overlapping picking areas being stored in the second list. In other words, identifiers stored in the first list are searched according to the overlapping picking areas receiving an event based, and the identifiers of manipulators are retrieved. The respective manipulators of the retrieved identifiers are then identified. As seen previously, the relations between the first and second lists may for instance rely on pointers between the two lists, as known in the art.

Next, at step S150, an event is received by the identified manipulators. An event is signal sent by the user to a manipulator. According to the event, the manipulator is able to perform an action.

Alternatively, the event can be received by the manipulator manager. In this configuration, the manipulator manager acts as an event proxy: the manipulator manager decides whether or not to transmit to manipulators the event received. In other terms, the manipulator manager exclusively communicates with the pointing device. During the subscribing step S102, a manipulator can additionally communicate to the manipulator manager a list of events for which the manipulator wishes to subscribe. As for the first and second lists, this list of events can be stored in a third list stored on storage, e.g. on a memory or on database. Therefore, each time the manipulator manager receives an event, it checks in the third list whether a manipulator is registered for this event, and transmit (or not) the event to a manipulator according to the result of the checking The event may be one of the following, but is not limited to: move (the cursor moves in the GUI), begin manipulate (the user click on a button of the haptic device in order to send a signal for beginning a drag and drop operation), manipulate (drag and drop operation), end manipulate (end of the drag and drop operation), activate (the user clicks and releases on a button of the haptic device), edit (the user double clicks on a button), context (the user clicks on a second button), . . .

Next, a set of filters is triggered in order to find out the manipulator (S170) to be activated. Triggering (or applying) a filter amounts to perform a test of data, e.g. a test on a manipulator.

Preferably, manipulators having at least one picking area receiving the event are selected (S160) before triggering the set of filters. In the case the manipulator manager acts as an event proxy, the manipulators having at least one picking area concerned by the event may be selected according to the events stored in the third list.

A set of filters is applied (S170), preferably on the selected manipulators (S160). The first filter consists in creating a subset of manipulators according to the event received: the manipulators that are likely to be interested by the event are identified. In the case the manipulator manager receives and manages the events as explained above, the manipulator manager can advantageously determine immediately the set of manipulators concerned by the event received, without requiring new computations. Therefore, the filter does not need to be triggered. Alternatively, the manipulator manager may test each registered manipulator whether or not it is concerned by the event for forming the subset of manipulators interested by the current event.

A second filter relies on a priority associated with each manipulator. Indeed, when a manipulator is created, it can be assigned a priority. The priority establishes an order of importance between the manipulators, the importance being therefore a characteristic of the manipulator. In practice, the priority of a manipulator is chosen among four levels of priority, and each level of priority may be represented by a priority value. In the event any priority is associated with a manipulator, the manipulator is attributed the lowest priority number by default. As a result, a subset of manipulator is created according to the priority associated with each manipulator.

A third filter consists in computing a distance between the pointing device and characteristic points of the manipulators. The characteristic points of the manipulator play the role of markers on the manipulator. In practice, the characteristic points of a manipulator are points of the manipulator chosen arbitrarily, e.g. by the developer of the manipulator. The minimal distance among the computed distances is determined, and the manipulator having the minimal distance with the pointing device is selected. The distance between the pointing device (e.g. the cursor) and the characteristic points can be performed onto a projection plan (e.g. the computer screen displaying the objects and their manipulators). When a manipulator comprises several characteristic points, a distance representing an average distance between the pointing device and the characteristic points is computed.

A fourth filter may be applied if several manipulators have an identical minimal distance. The fourth filter identifies the manipulator being the closest to the user location. This filter thus applies a depth criterion: the manipulator having the closest distance to the user viewpoint is selected.

In practice, the filters are sequentially triggered. This involves that each filter leads to the creation of a respective subset of manipulator, and each subsequent filter filters the subset created by the former filter. By this way, the operations are only performed on a set of manipulator and not on the whole set of manipulator initially provided at step 100. Advantageously, computing resources required to apply the filters are preserved inasmuch as the number of manipulators involved in the computing decreases for each filter. Preferably, the filters are triggered in the same order as they are described above: from the first filter to the fourth one. The manipulator manager can perform the filtering operations and can maintain the successive subsets of manipulators obtained from the successive filtering.

Next, at step S180, the remaining manipulator can be selected by the user. The manipulator is therefore activated; the activation of the manipulator is preferably performed by the manipulator manager. Consequently, all the events are sent to this selected manipulator, until the manipulator is unselected or another manipulator is selected. In practice, the routing of the received events is carried out by the manipulator manager. Once the manipulator is selected, the user can trigger the function associated with the manipulator according to the event, even if the picking zone of the remaining manipulator overlaps one or more picking zone of other manipulators.

Figure 10:
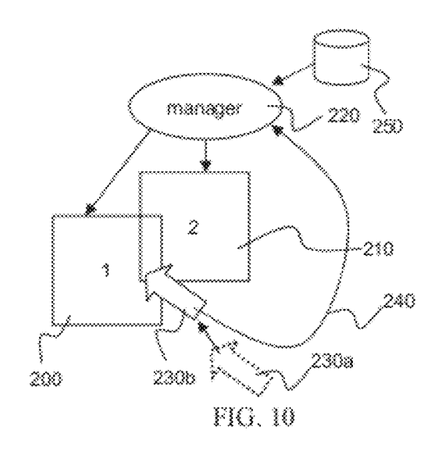

FIG. 10 illustrates the steps S110 to S180 of the process according to the invention. The cursor is moved from a first position 230a to a second position 230b: the cursor is now located on both the picking areas 200 and 210. While moving from the first to the second position, a ray is continuously cast in order to determine whether or not at least two picking areas are intersected by the ray (not represented). Once the cursor reaches the second position 230b, it is determined that the cursor is on overlapping picking areas 230a and 230b: the ray is intersecting the two picking areas. Then, the corresponding manipulators are identified via the first and second lists stored in the database 250: the identifier of the manipulators is retrieved, and then the manipulators are identified. The database 250 may provide a correspondence between the identifier of the manipulators and the manipulators.

Figure 11:
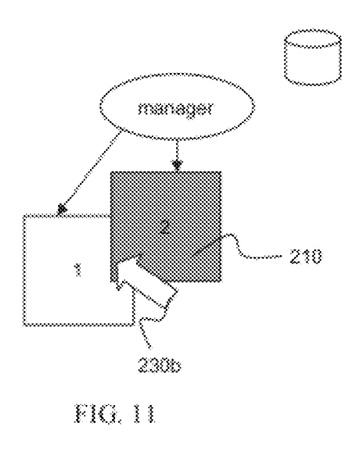

Upon user action, an event 240 is sent to a manipulator and received by the manipulator manager 220 acting as proxy of events. For instance, the event may be the cursor 230b that stops moving. Once the event is received by the manipulator manager 220, the database 250 is queried in order to retrieve a subset of manipulators among the list of candidate manipulators for selecting manipulators based on a new criterion: the manipulator interested in the current events. This constitutes the triggering of a first filter. Next, a second filter is triggered on the subset of manipulators obtained from the first filtering. The manipulator manager asks for the priority of each manipulator of the subset and deduces a new subset that comprises the manipulators having the most important priority (e.g. the highest priority value). Then, a third filter is executed on the remaining candidate manipulators: the manipulator manager asks the minimum distance of the remaining candidate manipulators to the current cursor 230b. Only the manipulator 210 remains and this manipulator 210 is activated, as illustrated on FIG. 11. The activation of the manipulator may be shown to the user, for instance with a new rendering of the manipulator. It is to be understood that if several manipulators are still candidates manipulator, another filter may applied. For instance, the manipulator having the closest distance from the user viewpoint is selected among the subset of remaining manipulators (or candidate manipulators); that is, the manipulator that is the closest to the user according to the user's viewpoint on the manipulators is selected.

The preferred embodiment of the present invention has been described. It will be understood that various modifications may be made without departing from the spirit and scope of the invention. Therefore, other implementations are within the scope of the following claims. It is to be understood that the invention may be carried out with any kind of cursor. For instance, on a touch sensitive screen, the user can directly perform an action on the screen, e.g. sending an event on pressing on the screen. This action amounts to perform the steps S110 to S150.

The invention claimed is:

1. A computer-implemented process for selecting a manipulator of an object among a plurality of objects displayed in a graphical user interface, each object comprising at least one manipulator, the process comprising the steps of:

providing a set of two or more manipulators, wherein each manipulator of the set of the manipulators performs a function to the object and includes at least one picking area that persistently extends beyond a visible representation of the manipulator, and wherein at least two picking areas of different manipulators of the set overlap;

receiving, upon a user interaction with the graphical user interface, an event of a list of events, the event applied on the said at least two overlapping picking areas, and the manipulators of said overlapping picking areas being registered for the event;

sequentially triggering a set of filters for selecting one manipulator, of the set of manipulators, to be activated in the set of manipulators, the set of filters is triggered on the manipulators that are registered for the event, wherein set of filters for selecting one manipulator includes steps of retrieving a subset of manipulators among the list of candidate manipulators, determining priority of each manipulator of the subset and deducing a new subset that comprises the manipulators having the most important priority, computing a minimum distance of the remaining candidate manipulators to the current cursor, and selecting the manipulator having the closest distance to the user viewpoint in response to determining the computed distance of the each of the manipulators are identical; and activating the selected manipulator.

2. The computer-implemented process of claim 1, further comprising the step of:

selecting manipulators from the set of manipulators, each selected manipulator having at least one picking area receiving the event.

3. The computer-implemented process of claim 1, further comprising the steps of:

casting a ray from a location in the graphical user interface;

determining an intersection between the ray and the said at least two overlapping picking areas.

4. The computer-implemented process of claim 1, further comprising a step of:

subscribing manipulators to a manipulator manager.

5. The computer-implemented process of claim 4, wherein the step of subscribing the manipulator comprises:

storing, for each manipulator, a respective identifier into a first list stored in a storage managed by the manipulator manager;

storing, for each manipulator, the respective at least one picking area into a second list stored in the storage managed by the manipulator manager.

6. The computer-implemented process of claim 5, further comprising a step of:

searching in the first list and retrieving the identifiers corresponding to the said at least two overlapping picking areas receiving an event stored in the second list;

identifying the respective manipulators of the retrieved identifiers.

7. An apparatus for selecting a manipulator of an object among a plurality of objects displayed in a graphical user interface, each object comprising at least one manipulator, the apparatus being adapted for:
- providing a set of two or more manipulators, wherein each manipulator of the set of the manipulators performs a function to the object and at least one picking area that persistently extends beyond a visible representation of the manipulator, and
- wherein at least two picking areas of different manipulators of the set overlap;
- receiving, upon a user interaction with the graphical user interface, an event of a list of events, the event applied on the said at least two overlapping picking areas, and the manipulators of said overlapping picking areas being registered for the event;
- sequentially triggering a set of filters for selecting one manipulator, of the set of manipulators, to be activated in the set of manipulators, the set of filters is triggered on the manipulators that are registered for the event,
- wherein set of filters for selecting one manipulator includes steps of retrieving a subset of manipulators among the list of candidate manipulators, determining priority of each manipulator of the subset and deducing a new subset that comprises the manipulators having the most important priority, computing a minimum distance of the remaining candidate manipulators to the current cursor, and selecting the manipulator having the closest distance to the user viewpoint in response to determining the computed distance of the each of the manipulators are identical; and
- activating the selected manipulator.

8. A computer readable storage medium having recorded thereon a computer program for selecting a manipulator of an object among a plurality of objects displayed in a graphical user interface, the computer program being adapted for causing the computer to:
- provide a set of two or more manipulators, wherein each manipulator of the set comprises at least one picking area that persistently extends beyond a visible representation of the manipulator, and wherein at least two picking areas of different manipulators of the set overlap;
- receive, upon a user interaction with the graphical user interface, an event of a list of events, the event applied on the said at least two overlapping picking areas and the manipulators of said overlapping picking areas being registered for the event;
- trigger a set of filters for selecting one manipulator, of the set of manipulators, to be activated in the set of manipulators, the set of filters is triggered on the manipulators that are registered for the event,
- wherein set of filters for selecting one manipulator includes steps of retrieving a subset of manipulators among the list of candidate manipulators, determining priority of each manipulator of the subset and deducing a new subset that comprises the manipulators having the most important priority, computing a minimum distance of the remaining candidate manipulators to the current cursor, and selecting the manipulator having the closest distance to the user viewpoint in response to determining the computed distance of the each of the manipulators are identical; and
- activate the selected manipulator.

* * * * *